(12) United States Patent
Harada et al.

(10) Patent No.: US 8,207,546 B2
(45) Date of Patent: Jun. 26, 2012

(54) SEMICONDUCTOR LIGHT-EMITTING DEVICE AND METHOD FOR MANUFACTURING THE SAME

(75) Inventors: Mitsunori Harada, Tokyo (JP); Masanori Sato, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 777 days.

(21) Appl. No.: 11/747,989

(22) Filed: May 14, 2007

(65) Prior Publication Data
US 2007/0267643 A1 Nov. 22, 2007

(30) Foreign Application Priority Data

May 17, 2006 (JP) ................................ 2006-137258

(51) Int. Cl.
*H01L 33/54* (2010.01)
*H01L 33/60* (2010.01)
(52) U.S. Cl. .................. 257/98; 257/E33.073
(58) Field of Classification Search ............ 257/79–103, 257/676, E33.073; 438/22–47, 106–127
See application file for complete search history.

(56) References Cited

U.S. PATENT DOCUMENTS

| | | | | |
|---|---|---|---|---|
| 6,480,389 | B1 * | 11/2002 | Shie et al. ...................... | 361/707 |
| 6,610,563 | B1 * | 8/2003 | Waitl et al. ..................... | 438/166 |
| 6,850,001 | B2 * | 2/2005 | Takekuma ..................... | 313/501 |
| 6,924,514 | B2 * | 8/2005 | Suenaga ......................... | 257/98 |
| 7,115,979 | B2 * | 10/2006 | Park et al. | |
| 7,326,583 | B2 * | 2/2008 | Andrews et al. ................ | 438/26 |
| 7,631,986 | B2 * | 12/2009 | Harrah ........................... | 362/230 |
| 7,646,035 | B2 * | 1/2010 | Loh et al. ....................... | 257/99 |
| 7,675,081 | B2 * | 3/2010 | Low et al. ...................... | 257/98 |
| 7,775,685 | B2 * | 8/2010 | Loh ........................... | 362/311.02 |
| 7,804,147 | B2 * | 9/2010 | Tarsa et al. .................... | 257/433 |
| 2001/0042865 | A1 | 11/2001 | Oshio et al. | |
| 2004/0245528 | A1 * | 12/2004 | Hiramoto ........................ | 257/79 |
| 2005/0139846 | A1 * | 6/2005 | Park et al. ....................... | 257/98 |
| 2005/0280014 | A1 * | 12/2005 | Park et al. ....................... | 257/98 |
| 2007/0045646 | A1 * | 3/2007 | Low et al. ....................... | 257/98 |
| 2007/0205425 | A1 * | 9/2007 | Harada ........................... | 257/98 |

FOREIGN PATENT DOCUMENTS

| | | |
|---|---|---|
| JP | 10261821 | 9/1998 |
| JP | 2005116817 | 4/2005 |
| JP | 2005136101 | 5/2005 |

\* cited by examiner

*Primary Examiner* — Kiesha Bryant
*Assistant Examiner* — Eric Ward
(74) *Attorney, Agent, or Firm* — Kenealy Vaidya LLP (57) ABSTRACT

A reliable semiconductor light-emitting device and a method for manufacturing the same can be provided in which peeling can be prevented in a phase boundary, and optical axis positional errors between the optical lens and a semiconductor light-emitting chip can be reduced or prevented. The semiconductor light-emitting device can include a base board having at least one chip, a reflector fixed on the base board so as to enclose the chip, and an encapsulating resin disposed in the reflector. An optical lens can include a concave-shaped cavity that has an inner corner surface having a plurality of convex portions thereon. The optical lens can be located adjacent the reflector by contacting the lens with a top surface of the reflector so as to enclose the reflector. A spacer that is disposed between the concave-shaped cavity and the reflector can ease a stress that is generated due to temperature changes.

38 Claims, 5 Drawing Sheets

SEMICONDUCTOR LIGHT-EMITTING DEVICE AND METHOD FOR MANUFACTURING THE SAME

This application claims the priority benefit under 35 U.S.C. §119 of Japanese Patent Application No. 2006-137258 filed on May 17, 2006, which is hereby incorporated in its entirety by reference.

BACKGROUND

1. Field

The presently disclosed subject matter relates to semiconductor light-emitting devices including LEDs, laser diodes, etc. and to a manufacturing method for the same. More particularly, the disclosed subject matter relates to semiconductor light-emitting devices as described above that emit light through an optical lens and to the manufacturing method for these devices.

2. Description of the Related Art

Figure 8:
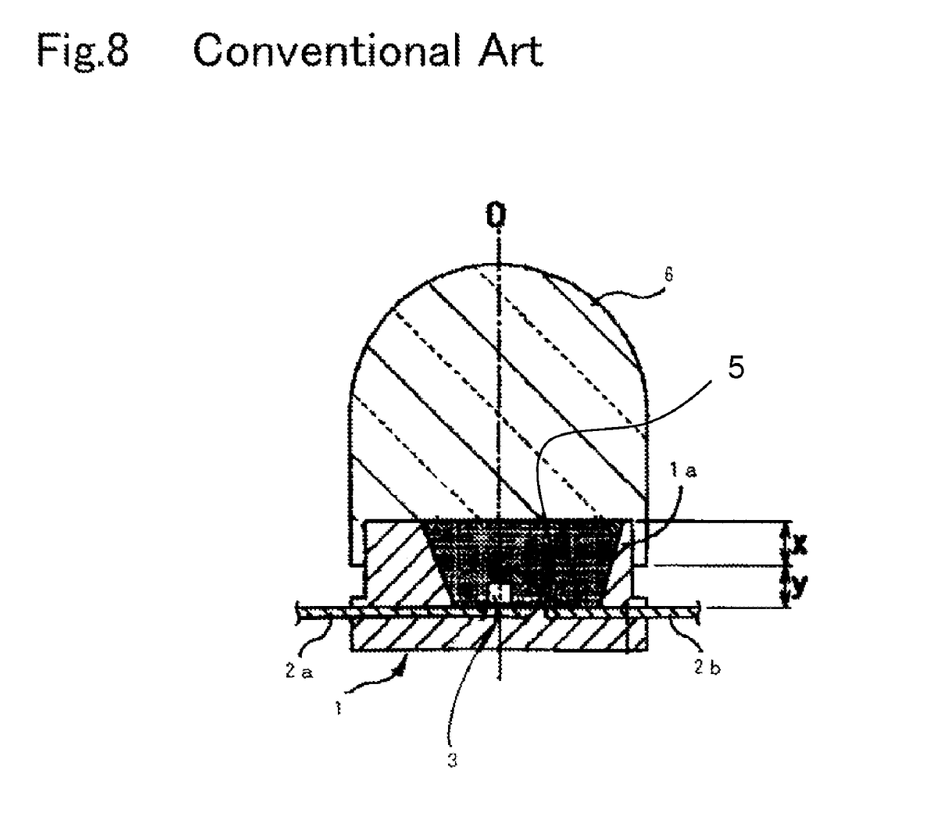
FIG. 8 is a cross-section summary view showing a structure for a conventional semiconductor light-emitting device.

A conventional semiconductor light-emitting device that emits light through an optical lens, for example, is disclosed in Patent Document No. 1 (Japanese Patent No. 3,492,178). According to Patent Document No. 1, and as shown in FIG. 8, a pair of lead frames 2a, 2b is insert-formed in a casing 1 that includes a cavity 1a for reflecting the light of a LED chip 3. The pair of lead frames 2a, 2b is depicted on a bottom surface of the cavity 1a.

The LED chip 3 is mounted on the lead frame 2a via a conductive material and has one electrode thereof that is electrically connected to the lead frame 2a. The other electrode of the LED chip 3 is electrically connected to the lead frame 2b via a bonding wire. An encapsulating resin 5 is disposed in the cavity 1a so as to encapsulate the LED chip 3. An optical lens 6 that is made from a transparent resin and is formed in a dome-shape is disposed on the cavity la that includes the encapsulating resin 5.

Figure 9:
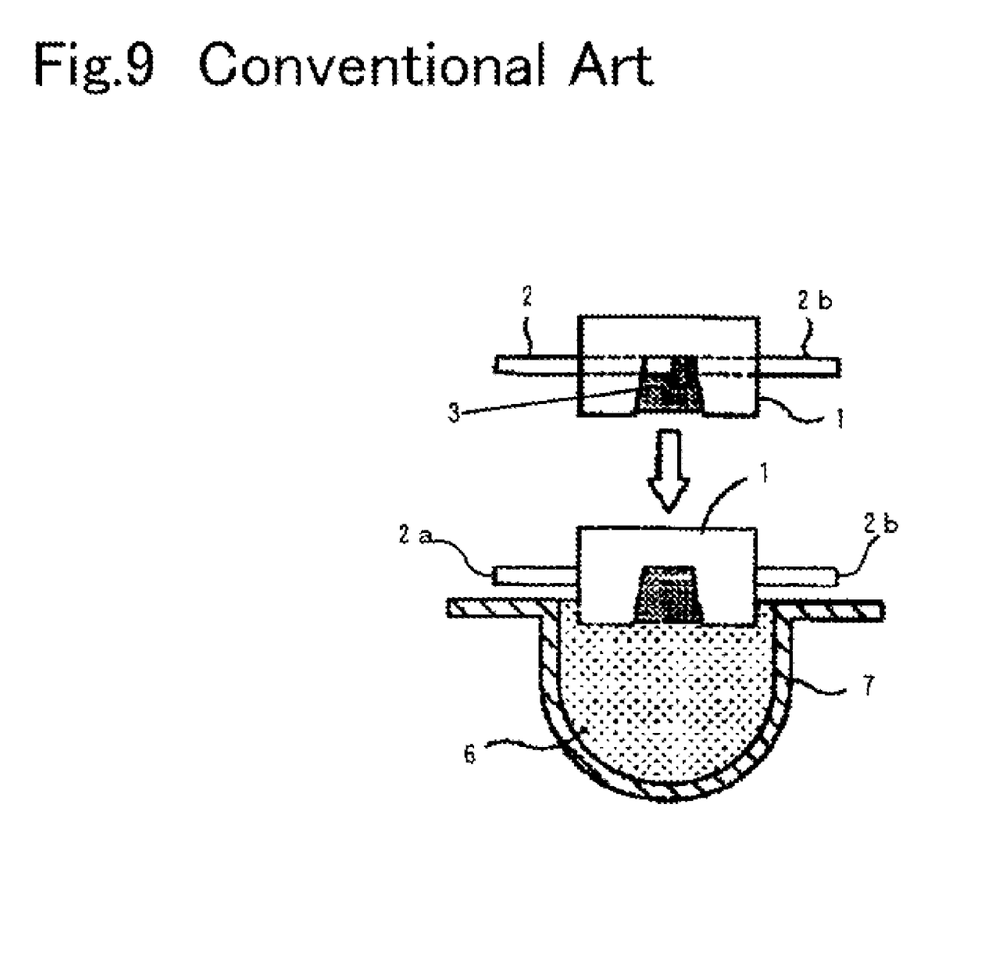
FIG. 9 is a side cross-section decomposed view showing a state of a process in the manufacturing method for the conventional semiconductor light-emitting device shown in FIG. 8.

When the optical lens 6 is formed, the casing 1 that includes the encapsulating resin 5 in the cavity la and which includes the LED chip 3 mounted therein is placed upside down into a die 7. A liquid transparent resin is filled in the die 7 before being solidified, as shown by FIG. 9. The pair of lead frames 2a, 2b extends in both side directions from the casing 1 and operate as a stopper by contacting a top side surface of the die 7. The casing 1 is located at a predetermined position in the die 7 by the above-described operation. The optical lens 6 is formed by solidifying the liquid transparent resin in such a state. In the above process, the transparent resin becomes liquid by heating it and the liquid transparent resin is solidified by returning it to a normal or ambient temperature. Finally, the LED device is completed by removing the casing 1 from the die 7.

In the LED device such as described above, the light that is emitted from the LED chip 3 emits outside of the LED device via the encapsulating resin 5 and the optical lens 6. The light-emitting characteristic of the LED device is basically determined by the optical characteristics of the optical lens 6.

Furthermore, in the LED device as described above, phase boundaries without a chemical bond are caused between the casing 1 and the optical lens 6, and between the encapsulating resin 5 and the optical lens 6. An operating temperature of an LED device is generally in the range of −20 degrees centigrade to +80 degrees centigrade and can be a particularly wide range of −40 degrees centigrade to +100 degrees centigrade when used in vehicle applications. An LED device should be configured to operate stably within such a wide temperature range.

However, both a thermal expansion coefficient and a heat shrinkage coefficient of the casing 1, the encapsulating resin 5 and the optical lens 6 are respectively different because each uses a different material. Thus, the phase boundaries without the chemical bond are stressed by the difference of both the thermal expansion coefficients and the heat shrinkage coefficients when the boundaries are subjected to a temperature change. The phase boundaries may be peeled from each other or otherwise compromised as the case may be. For example, when the LED device is mounted on a circuit board by a reflow process, the phase boundaries are often peeled due to large temperature changes.

The peeling of the phase boundaries can result in a decrease of the light-emitting brightness because of light reflections in the phase boundaries. When materials having a high hardness are used, the peeling effect is especially prevalent. Furthermore, because the conventional LED device is located in the die 7 by the pair of lead frames 2a, 2b, the LED device can not be exactly located in a horizontal direction. Thus, an error of placement of an optical axis (O) in the LED device may result.

LED devices that are configured to prevent the peeling that can occur due to differences between the above-described thermal expansion coefficients and the heat shrinkage coefficients are disclosed in Patent Document No. 2 (Japanese Patent Application Laid Open JP2005-116817) and Patent Document No. 3 (Japanese Patent Application Laid Open JP2005-136101).

In Patent Document No. 2, an LED device is provided with a surplus storage part for holding an encapsulating resin with a high thermal expansion coefficient. The LED device may be configured to prevent peeling by providing an amount of encapsulating resin that is caused by heat shrinkage and expansion to move into and out of the surplus storage area when experiencing high and low temperatures, respectively In Patent Document No. 3, an LED device is provided with an ease part in a part of the contact surface between a lamp house structure and an encapsulating resin in order to ease a stress that is caused in the phase boundaries between the two materials that make up these structures. In addition, cohesiveness can be increased between the encapsulating resin and the adjacent optical lens by providing a surface treatment on an inner surface of the optical lens. The above-referenced Patent Documents are listed below, and are hereby incorporated with their English abstracts in their entireties.

1. Patent Document No. 1: Japanese Patent No. 3,492,178
2. Patent Document No. 2: Japanese Patent Application Laid Open JP2005-116817
3. Patent Document No. 3: Japanese Patent Application Laid Open JP2005-136101

However, in the LED devices disclosed in Patent Document No. 2, providing a surplus storage part for the insufficient encapsulating resin may result in decreasing the light-emitting efficiency because the part may intercept a part of the light that is emitted from an LED chip. Moreover, because the encapsulating resin moves between the cavity and the storage part around the storage part according to a temperature change, peeling may be caused between the optical lens and locations near the storage part. In addition, because a shrinking stress is generated in the whole encapsulating resin when solidifying the liquid encapsulating resin, the peeling may be more easily caused in the above-described phase boundaries.

In the semiconductor light-emitting devices disclosed in Patent Document No. 3, the peeling in the above-described phase boundaries may be prevented due to the added cohesiveness between the optical lens and the encapsulating resin when the surface treatment on the inner surface of the optical lens is applied. The stress that is generated on the contact surface between the cavity and the encapsulating resin is partly eased by providing the expansion relief part in part of the contact surface. However, part of the expansion relief part may promote peeling in other contact surfaces outside of the expansion relief part.

The disclosed subject matter has been devised to consider the above and other problems and characteristics. Thus, embodiments of the disclosed subject matter can include semiconductor light-emitting devices and associated manufacturing methods that do not cause some of the above-described various problems and characteristics related to peeling in the phase boundaries. The disclosed subject matter can also include an LED device that is configured to decrease an optical axis positional error that is caused between the optical lens and a semiconductor light-emitting chip, and can reduce or change other associated problems and characteristics of the conventional devices and methods.

SUMMARY OF THE DISCLOSED SUBJECT MATTER

The presently disclosed subject matter has been devised in view of the above and other problems and characteristics. Another aspect of the disclosed subject matter includes methods of manufacture and their associated devices that provide various semiconductor light-emitting devices with high reliability.

According to an aspect of the disclosed subject matter, a semiconductor light-emitting device can include: a base board having at least one pair of chip mounting portions, whereon at least one semiconductor light-emitting chip is mounted; a reflector being formed in a substantially tubular shape, and fixed on the base board so as to enclose the at least one semiconductor light-emitting chip; an encapsulating resin disposed in the reflector; an optical lens having a concave-shaped cavity, an inner corner surface of the optical lens is configured to provide a plurality of convex portions thereon that face a top surface of the reflector; and a spacer being composed of a softer transparent resin than the optical lens and disposed between the concave-shaped cavity of the optical lens and the reflector that includes the encapsulating resin.

In the above described exemplary semiconductor light-emitting device, the semiconductor light-emitting device can also include a plurality of convex portions that can be provided on a top surface of the reflector instead of the optical lens 16 that includes the plurality of convex portions. The plurality of convex portions of both the optical lens and the reflector can be formed at substantially equal intervals with the width and height between approximately 0.1 mm and 2.0 mm, for example.

In the above described exemplary semiconductor light-emitting device, the encapsulating resin can be at least one of a transparent resin and a mixture resin, and the mixture resin can include a resin mixed with at least one of a diffuser, a wavelength conversion material such as a phosphor, and/or a pigment for selectively absorbing light having a predetermined wavelength. In the above described exemplary semiconductor light-emitting device, the spacer can be composed of the same material as the encapsulating resin.

Another aspect of the disclosed subject matter includes a method for manufacturing the above-described semiconductor light-emitting devices that can include: preparing a base board that includes at least one pair of chip mounting portions, whereon at least one semiconductor light-emitting chip is mounted and is electrically connected, the base board fixing a reflector that is formed in a substantially tubular shape and which includes a cavity so as to enclose the at least one semiconductor light-emitting chip therein; filling an encapsulating resin in the cavity of the reflector and solidifying it to a half solidified state by heating; providing a spacer that is not solidified, disposing the spacer over the reflector that includes the encapsulating resin; providing an optical lens that includes a concave-shaped cavity, disposing the optical lens on the reflector; and solidifying both the encapsulating resin and the spacer by heating.

In the above described exemplary method for manufacturing the semiconductor light-emitting devices, an inner corner surface of the optical lens or a top surface of the reflector can include a plurality of convex portions. The plurality of convex portions can be formed at substantially equal intervals with the width and height between substantially 0.1 mm and 2.0 mm, for example.

In the above described exemplary method for manufacturing the semiconductor light-emitting devices, the encapsulating resin can be at least one of a transparent resin and a mixture resin, and the mixture resin can include a resin mixed with at least one of a diffuser, a wavelength conversion material such as a phosphor, and a pigment for selectively absorbing light having a predetermined wavelength. The spacer can be composed of the same material as the encapsulating resin.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
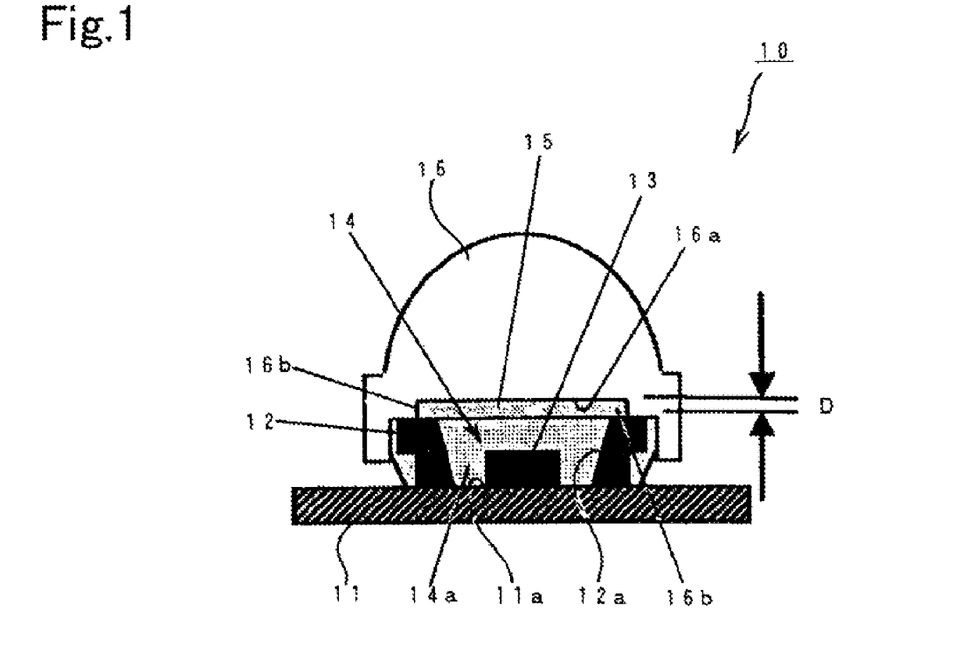
FIG. 1 is a side cross-section summary view showing a structure for a first exemplary embodiment of a semiconductor light-emitting device made in accordance with principles of the disclosed subject matter.
Figure 2:
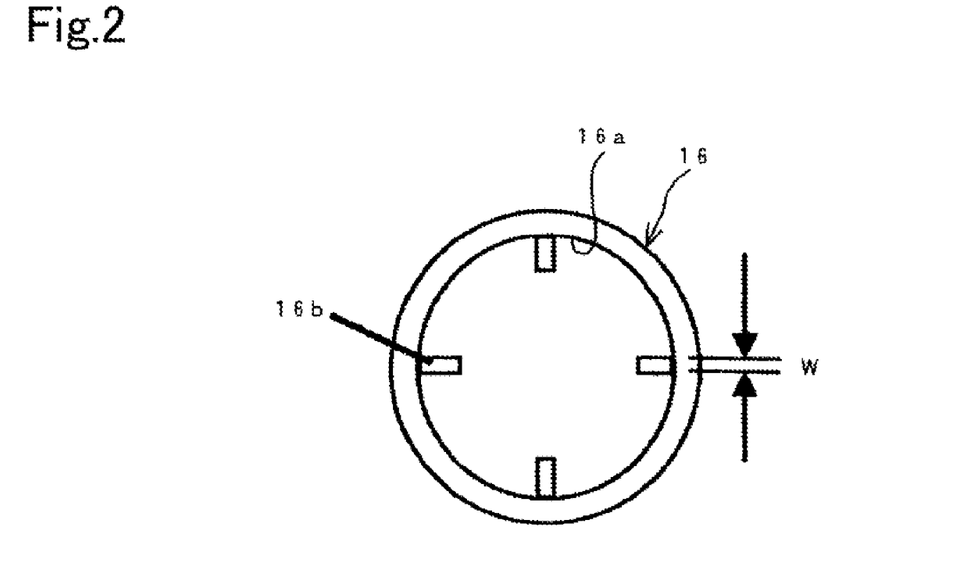
FIG. 2 is a bottom view showing the optical lens of the semiconductor light-emitting device shown in FIG. 1.

The first exemplary embodiment of the disclosed subject matter will now be described in detail with reference to FIG. 1 and FIG. 2. FIG. 1 is a cross-sectional view of a first exemplary embodiment made in accordance with principles of the disclosed subject matter and FIG. 2 is a bottom view showing an optical lens of the semiconductor light-emitting device shown in FIG. 1.

The semiconductor light-emitting device 10 can include: a base board 11 having a pair of chip mounting portions 11a; a reflector 12 that is formed in a substantially tubular shape with a cavity 12a, and disposed on the base board so as to enclose the pair of chip mounting portions 11a in the cavity 12a; a semiconductor light-emitting chip 13 that is mounted on the pair of chip mounting portions 11a, which are exposed on a bottom surface of the cavity 12a; an encapsulating resin 14 disposed in the cavity 12a of the reflector 12; a spacer 15 disposed over the reflector 12 that includes the encapsulating resin 14 located therein; and an optical lens 16 having a concave-shaped cavity 16a, disposed on/above the spacer 15 so as to enclose a top outside surface of the reflector 12.

The base board can be made using high temperature conductive materials, such as a metal board that is provided with Au, Al, and the like with an insulating layer thereon or a ceramic substrate, such as $Al_2O_3$, AlN, SiC, $Si_3N_4$ and $ZrO_2$. The base board 11 can be formed with electrode conductor patterns on a surface thereof and the electrode conductor patterns can be connected to the pair of chip mounting portions 11a located substantially at a center of the base board 11. The electrode conductor patterns can be electrically connected to a circuit board by leading it on and/or under the base board 11.

The reflector 12 can be composed of an opaque resin material, metal material, ceramic material and the like, and can be fixed at a predetermined position on the base board 11 via a wax, an adhesive material with a high temperature conductivity, etc. The reflector 12 can include the cavity 12a for exposing the pair of chip mounting portions 11a and for reflecting the light of a semiconductor light-emitting chip 13. Thus, an inner surface of the cavity 12a may be concave-shaped so as to expand upwards. The reflector 12 can be integrated with the base board 11 as one body. In the case when they are formed as one body, the base board 11 including the reflector 12 can be insert-formed with the pair of chip mounting portions 11a using lead frames.

The semiconductor light-emitting chip 13 can be, for example, a blue LED chip and can be mounted on the pair of chip mounting portions 11a of the base board 11 in the cavity 12a of the reflector 12. The pair of chip mounting portions 11a can be electrically connected to both electrodes of a semiconductor light-emitting chip 13 via die bonding and wire bonding, respectively. When a semiconductor light-emitting chip 13 is mounted on one portion of the pair of chip mounting portions 11a via die bonding, a solder, a silver paste and the like can be used as an adhesive material that is electrically conductive.

The encapsulating resin 14 can be composed of a transparent resin and a mixture resin 14a, and the mixture resin can include a resin mixed with at least one of a diffuser, a wavelength conversion material such as a phosphor, and a pigment for selectively absorbing light having a predetermined wavelength. When the above semiconductor light-emitting chip 13 is a blue LED chip, the semiconductor light-emitting device 10 can emit light of approximately white color tone through the encapsulating resin 14, which is mixed with the mixture resin 14a for converting blue light to a yellow light that is a complementary color of the blue light. A part of the blue light emitted from a blue LED chip excites the mixture resin 14a and is converted to yellow light, which can be mixed with another part of the blue light emitted from a blue LED chip by means of additive color mixture. Thus, the semiconductor light-emitting device 10 can emit light having an approximately white color tone.

When the encapsulating resin 14 is solidified, because the solidifying speed of the encapsulating resin 14 can be controlled by using a lower temperature than a normal solidifying temperature, the encapsulating resin 14 can be solidified so as to maintain a half solidified state.

The spacer 15 can be composed of a softer transparent resin (a soft resin material) that is softer than the optical lens 16, as described later, and can be disposed over the reflector 12 with substantially uniform thickness so as to cover a top surface of the encapsulating resin 14. The spacer 15 can be formed in a state that is not solidified and can be disposed over the reflector 12, and can also be disposed over the half solidified encapsulating resin 14 in the cavity 12a. A volume amount or thickness of the spacer 15 can be controlled in accordance with a volume of an inner space between the concave-shaped cavity 16a of the optical lens 16 and a top surface of the reflector 12 that includes the top surface of the encapsulating resin 14, and in accordance with a volume that is expanded around the outside surface of the reflector 12.

After the spacer 15 is filled in the concave-shaped cavity 16a inside the optical lens 16 by disposing the optical lens 16 on the reflector 12, the spacer 15 can be solidified by heating and the like. Thus, when the spacer 15 is solidified, the spacer can be chemically associated with the encapsulating resin 14 and can be integrated.

The optical lens 16 can be composed of a transparent resin, for example, a glass, an epoxy resin, a silicon resin and the like, and can be composed of a silicon resin that has a hardness within the range of substantially 30 to 100 in JIS hardness A. The optical lens 16 can be formed in a dome-shape such that an upper surface thereof can be convex-shaped and a bottom surface thereof can be planar. Furthermore, the optical lens 16 can include a concave-shaped cavity 16a therein located opposite the convex dome shape in order to enclose the reflector 12. The concave-shaped cavity 16a can include a plurality of convex portions 16b at substantially equal intervals on inner corner surfaces thereof as shown in FIG. 2. Thus, because an outside under portion of the optical lens 16 (the outer edge around the concave-shaped cavity 16a) can extend downwards so as to enclose the outside surface of the reflector 12 therein, the optical lens 16 can be accurately located in a horizontal direction (direction substantially perpendicular to the light emitting direction or optical axis of the device).

When the optical lens 16 is disposed on the reflector 12, because the plurality of convex portions 16b in the concave-shaped cavity 16a can contact the top surface of the reflector 12, the optical lens 16 can also be accurately located in the vertical (light emitting) direction. A width W of the plurality of convex portions can be in the range of substantially 0.1 mm to 2.0 mm, for example, and can also be within the range of 0.2 mm to 1.0 mm in order to ease a stress that is sometimes generated when solidifying the encapsulating resin 14 and the adjacent spacer 15. The plurality of convex portions 16b can efficiently ease stress that is generated in the phase boundary between the spacer 15 and the optical lens 16 due to outside temperature change because the plurality of convex portions 16b can operate as a stress-eased stage by contacting the reflector 12 at small points.

Each height D of the plurality of convex portions 16b can be in the same range of substantially 0.1 mm to 2.0 mm and more particularly can be within the same range of substantially 0.2 mm to 0.5 mm depending on thermal expansion coefficients of both the encapsulating resin 14 and the optical lens 16, and according to an outside temperature change.

The semiconductor light-emitting device 10 in the exemplary embodiment of FIGS. 1 and 2 can be configured as described above and can be manufactured using a method described in more detail below.

Figure 3:
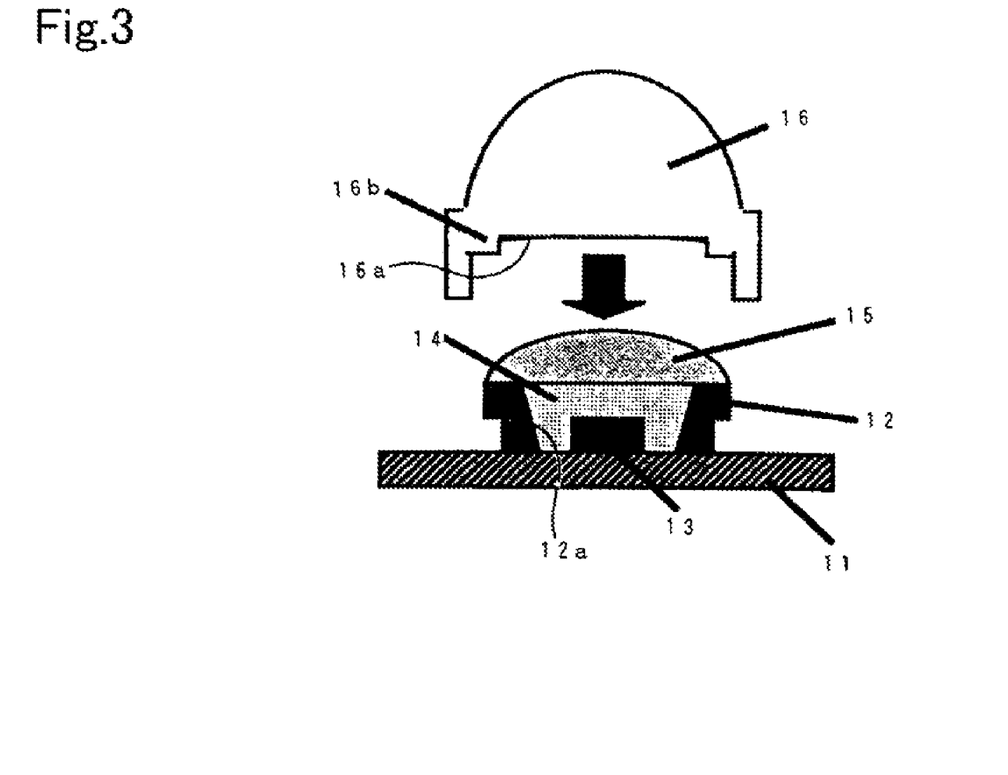
FIG. 3 is a side cross-section decomposed view showing a state of a process in an exemplary manufacturing method for the semiconductor light-emitting device shown in FIG. 1.

The method for manufacturing semiconductor light-emitting devices can include: preparing or providing a base board 11 that includes at least one pair of chip mounting portions 11a, whereon at least one semiconductor light-emitting chip 13 is mounted and is electrically connected, fixing a reflector 12 to the base board, the reflector being formed in a substantially tubular shape with a cavity 12a so as to enclose the at least semiconductor light-emitting chip 13 therein. The method can include filling an encapsulating resin 14 in the cavity 12a and solidifying the encapsulating resin 14 to a half solidified state by heating. A spacer 15 that is not solidified can be disposed over both the reflector 12 and the encapsulating resin 14 (as shown in FIG. 3). The method can also include disposing an optical lens 16 on the reflector 12. Both the encapsulating resin 14 and the spacer 15 can be solidified by heating.

When filling the cavity 12a with the liquid encapsulating resin 14, the resin 14 is not solidified, and can be filled by use of a dispenser or the like. The liquid encapsulating resin 14 can be solidified in a half solidified state by heating to a lower temperature than a normal solidifying temperature and can be solidified so as to control a catalyst reaction by controlling a heating temperature.

When the spacer 15 is disposed over the reflector 12, the spacer 15 can be convex-shaped by a surface tension as shown in FIG. 3. Further, when the optical lens 16 is disposed on the reflector 12, the optical lens 16 can be positioned accurately in a horizontal direction by being guided via an outside surface of the reflector 12 and an inner surface of the optical lens 16. The lens 16 can also be positioned accurately in a vertical direction by contacting the plurality of convex portions 16b of the optical lens 16 to the top surface of the reflector 12. Thus, the spacer 15 can be caused to fill in the concave-shaped cavity 16a and can be uniformly formed with substantially the same thickness as the height of the concave-shaped cavity 15a.

The spacer 15 and the encapsulating resin 14 can be chemically associated and can be respectively integrated via heating.

The encapsulating resin 14 can be composed of a transparent resin and a mixture resin 14a, and the mixture resin 14a can include a resin mixed with at least one of a diffuser, a wavelength conversion material such as a phosphor, and a pigment configured to selectively absorb light having a predetermined wavelength. When a semiconductor light-emitting chip 13 used in the above-described manufacturing method is a blue LED chip, the semiconductor light-emitting device 10 can emit light of approximately white color tone through the encapsulating resin 14, which is mixed with the mixture resin 14a for converting blue light to yellow light. The light also travels via the spacer 15 and the optical lens 16.

The encapsulating resin 14 and the optical lens 16 as shown in FIG. 1 are not necessarily directly in contact with each other, and instead include a spacer 15 sandwiched between the encapsulating resin 14 and the optical lens 16. Thus, the plurality of convex portions 16b of the optical lens 16 can partially ease a stress that is generated in the phase boundaries of the spacer 15 due to outside temperature change. The phase boundary between the encapsulating resin 14 and the spacer 15 can be chemically associated with each other. In addition, the spacer 15 can be composed of a material that is softer than the material of the optical lens 16 (e.g., the spacer 15 can be a soft resin material). Therefore, an adhesion between the optical lens 16 and the spacer 15 can be excellent, and the encapsulating resin 14 and the optical lens 16 can be prevented from being peeled by the stress that is generated due to change in outside temperature.

The above characteristics are especially observable when the optical lens 16 is composed of silicon resin, for which hardness is in the range of 30 to 100 in JIS hardness A. Because in this case, the optical lens 16 can provide an elasticity like rubber, the peeling between the optical lens 16 and the spacer 15 from the stress that is generated by outside temperature change can be avoided. When a big vertical stress occurs that the spacer 15 alone can not absorb through its own elasticity, the vertical stress can be absorbed via the plurality of convex portions 16b of the optical lens 16 which can move upwards from the top surface of the reflector 12.

Further more, the optical lens 16 can be accurately positioned in a horizontal direction of the reflector 12 by inserting the lens 16 with the outside surface of the reflector 12 guided by the inner surface of the optical lens 16. The lens 16 can also be accurately positioned in a vertical direction of the reflector 12 by contacting the plurality of convex portions 16b of the optical lens 16 to the top surface of the reflector 12. Thus, the optical lens 16 can be exactly located in the directions of both an optical horizontal axis and an optical vertical axis with respect to both the semiconductor light-emitting chip 13 and the optical lens 16. Consequently, the above-described manufacturing method can provide a semiconductor light-emitting device 10 that has high reliability.

Figure 4:
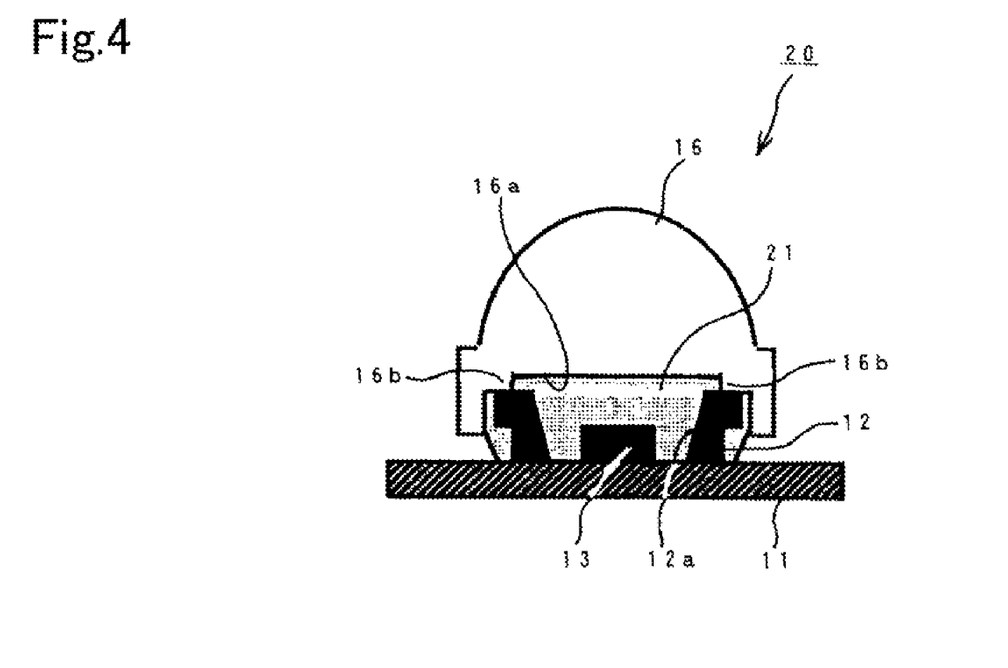
FIG. 4 is a side cross-section summary view depicting a second exemplary embodiment of a semiconductor light-emitting device made in accordance with principles of the disclosed subject matter.

A second exemplary embodiment of the disclosed subject matter will now be given with reference to FIG. 4. A semiconductor light-emitting device 20 of the second exemplary embodiment is shown in FIG. 4, wherein the same or similar elements shown in FIGS. 1 and 4 are referenced by same reference numerals. The semiconductor light-emitting device 20 can be similar to the semiconductor light-emitting device 10 shown in FIG. 1. A difference between the semiconductor light-emitting device 20 and the semiconductor light-emitting device 10 can include use of an encapsulating resin 21 that is an integration of the encapsulating resin 14 and the spacer 15 in the semiconductor light-emitting device 10.

The encapsulating resin 21 can be composed of a softer transparent resin than the material from which the optical lens 16 is made. The encapsulating resin 21 can be filled in a cavity 12a of a reflector 12 and can be disposed in a convex-shape over the reflector 12 before the resin 21 is solidified.

Figure 5:
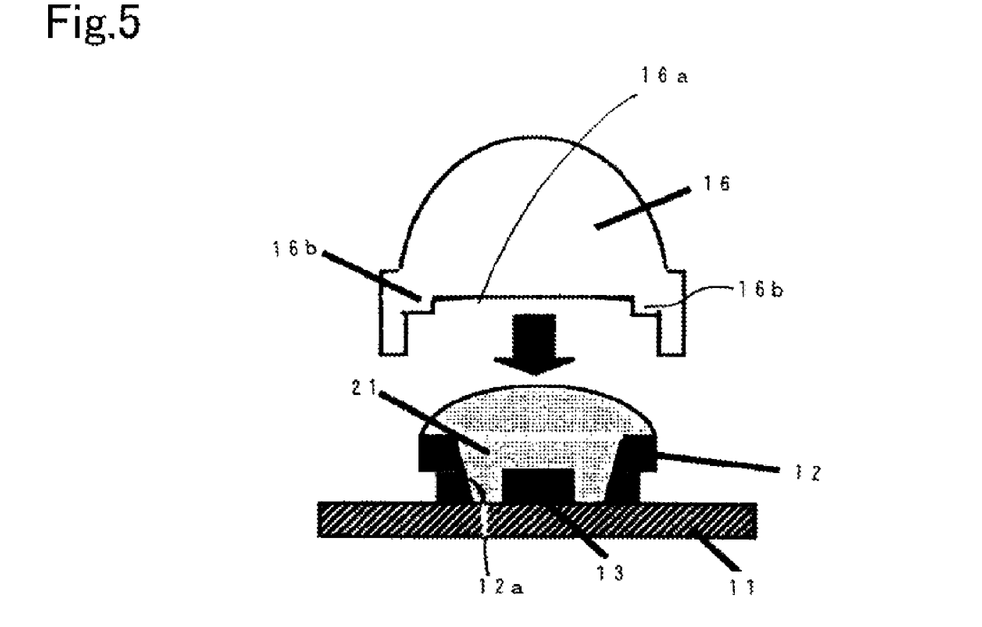
FIG. 5 is a side cross-section decomposed view showing a state of an exemplary process of a manufacturing method for the semiconductor light-emitting device shown in FIG. 4.

When the optical lens 16 is disposed on the reflector 12, the encapsulating resin 21 can be disposed so as to overflow from a top surface of the reflector 12 and into a volume of an inner space between the concave-shaped cavity 16a and a cavity 12a of the reflector 12. The overflowing volume can also expand around an outside surface of the reflector 12. The above-described encapsulating resin 21 can fill in the concave-shaped cavity 16a by disposing the optical lens 16 on the reflector 12 as shown in FIG. 5, and can be solidified by heating.

The semiconductor light-emitting device 20 having the above-described structure can operate in a similar manner as the semiconductor light-emitting device 10 shown in FIG. 1. The optical lens 16 can be exactly located in the directions of both an optical horizontal axis and an optical vertical axis of both the semiconductor light-emitting chip 13 and the optical lens 16.

Furthermore, because the encapsulating resin 21 can incorporate both the encapsulating resin 14 and the spacer 15, a two stage filling process as described above in paragraph [0046]

can be avoided, and the resin 21 can be filled in one process. Thus, both manufacturing cost and manufacturing time can be decreased. In addition, because the semiconductor light-emitting device 20 does not include the phase boundary between the encapsulating resin 14 and the spacer 15 that is included in the semiconductor light-emitting device 10, the possibility of peeling in this phase boundary can be avoided.

Figure 6:
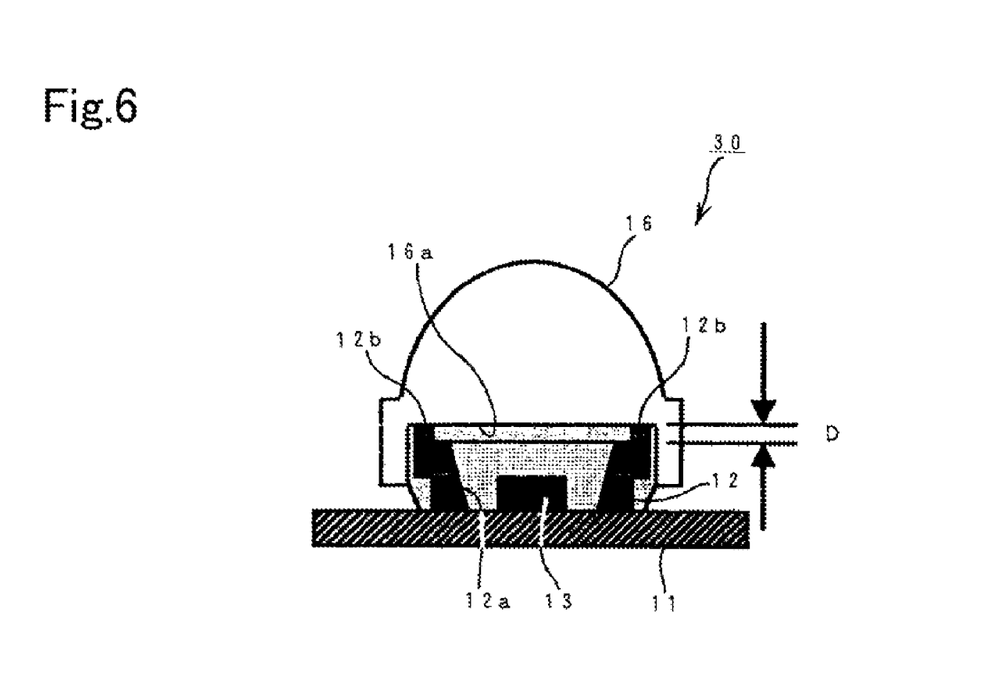
FIG. 6 is a side cross-section summary view depicting another exemplary embodiment of a semiconductor light-emitting device made in accordance with principles of the disclosed subject matter.

A third exemplary embodiment of the disclosed subject matter will now be described in detail with reference to FIG. 6. FIG. 6 shows a semiconductor light-emitting device 30 that can be configured similar to the semiconductor light-emitting device 10 shown in FIG. 1. Thus, the same or similar elements in FIG. 6 are referenced using the same reference numerals as those in FIG. 1. A difference between the semiconductor light-emitting device 30 and the semiconductor light-emitting device 10 can include a plurality of convex portions 12b that can be provided on a top surface of the reflector 12 in the semiconductor light-emitting device 30 (as compared to the optical lens 16 that can include the plurality of convex portions 16b in the semiconductor light-emitting device 10).

Figure 7:
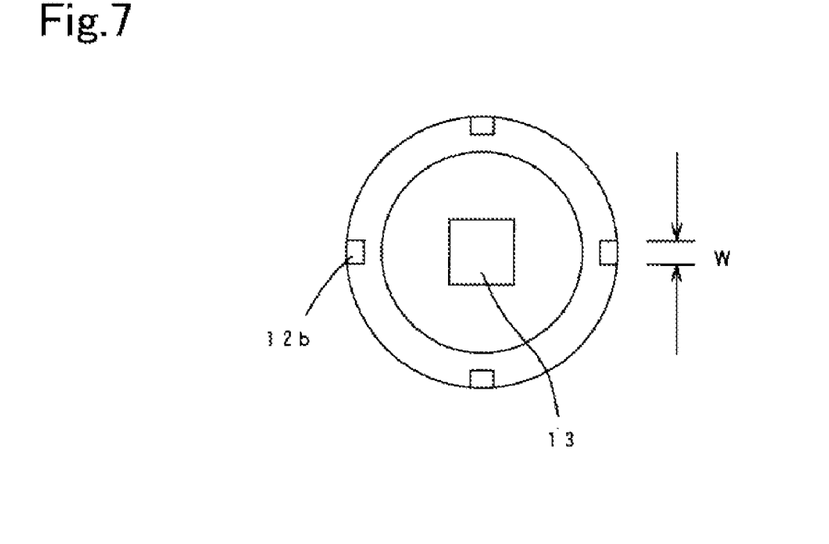
FIG. 7 is a top view showing the reflector for the semiconductor light-emitting device shown in FIG. 6.

The above-described plurality of convex portions 12b can be provided on the top surface of the reflector 12 at substantially equal intervals. When the optical lens 16 is disposed on the reflector 12, the optical lens 16 can be accurately located in the vertical direction by contacting the plurality of convex portions 12b to a bottom surface of the convex-shaped cavity 16a of the optical lens 16. Each width W of the plurality of convex portions 12b can be in the range of substantially 0.1 mm to 2.0 mm and can be within the range of substantially 0.2 mm to 1.0 mm. The plurality of convex portions 12b can efficiently ease the stress without substantially shading a light that is emitted from the semiconductor light-emitting chip 13.

Each height D of the plurality of convex portions 12b can be uniform and in the same range of substantially 0.1 mm to 2.0 mm and more particularly can be within the range of substantially 0.2 mm to 0.5 mm depending on thermal expansion coefficients of both the encapsulating resin 14 and the optical lens 16, and the outside temperature differential.

Results of an exemplary experiment using the semiconductor light-emitting device 10 are described as follows. When LED devices for the semiconductor light-emitting device 10 of FIG. 1 are produced using optical lenses that are made from a silicon resin with JIS hardness A=70-80 and with a thermal expansion coefficient=$3\times10^{-4}$ (1/K) and both the encapsulating resins and the spacers that are made from the same silicon resin with JIS hardness A=20-30 and a thermal expansion coefficient=$3\times10^{-4}$ (1/K), the optical lenses can be exactly located and peeling among the encapsulating resin 14, the spacer 15 and the optical lens 16 is not observable during changes in an outside temperature.

The disclosed subject matter can include the use of a spacer 15 that is composed of a soft transparent resin and is disposed over the reflector 12 so as to enclose a surface of both the reflector 12 and the encapsulating resin 14. When the optical lens 16 is disposed on the reflector 12, the spacer 15 can cause placing and sticking between surfaces of both the reflector 12 and the encapsulating resin 14 and an inner surface of the optical lens 16.

The optical lens 16 can be exactly located in the vertical direction at a predetermined space between the optical lens 16 and the reflector 12 when using either plurality of convex portions 12b or 16b thereon, and also can be exactly located in the horizontal direction in order to enclose the reflector 12 therein. Thus, an optical axis between the optical lens 16 and a semiconductor light-emitting chip 13 can be exactly positioned. The plurality of convex portions 12b and/or 16b can operate to ease stresses in the constituent materials that are generated between and/or among the reflector 12, the encapsulating resin 14 and the optical lens 16 when an outside temperature changes. Furthermore, when a big vertical stress is generated by a large temperature change and the spacer 15 can not absorb this big vertical stress, the big vertical stress can nonetheless be absorbed because the optical lens 16 can move upwards from the reflector.

Thus, the disclosed subject matter can provide a semiconductor light-emitting device with high reliability that can include a small error of positioning of the optical axis and little or no peeling, and a method for manufacturing the same.

In addition other light-emitting devices such as laser diodes, etc., and other types of semiconductor chips in general can be used in place of the LED chips 13 described above for use as the electrical component without departing from the spirit and scope of the presently disclosed subject matter.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A semiconductor light-emitting device comprising:
  a base board having at least one pair of chip mounting portions;
  at least one semiconductor light-emitting chip located adjacent the base board and configured to emit light along an optical axis of the device;
  a reflector located adjacent the base board and the at least one semiconductor light-emitting chip, the reflector including an inner side surface configured to reflect light from the at least one semiconductor light emitting chip during operation of the at least one semiconductor light emitting chip, an outer peripheral side surface facing away from and opposed to the inner side surface, and a top surface located between the inner side surface and the outer peripheral side surface, the outer peripheral side surface being an outermost peripheral surface of the reflector in a radial direction away from the optical axis of the device;
  an encapsulating resin disposed in the reflector;
  an optical lens having a concave-shaped cavity including an inner corner surface and a plurality of convex portions located at the inner corner surface, the plurality of convex portions contacting the top surface of the reflector and configured to face the top surface of the reflector, and the optical lens being composed of a material having a first softness; and
  a spacer composed of a transparent resin that has a second softness that is softer than the first softness of the material of the optical lens, the spacer being located between the concave-shaped cavity of the optical lens and the top surface of the reflector, including spaces between each of the plurality of convex portions of the optical lens, the spacer extending along the top surface of the reflector and extending downward towards the base board and along at least a portion of the outer peripheral side surface.

2. A semiconductor light-emitting device comprising:
  a base board having at least one pair of chip mounting portions;
  at least one semiconductor light-emitting chip located adjacent the base board and configured to emit light along an optical axis of the device;

a reflector including a top surface that has a plurality of convex portions, the reflector including a bottom surface located adjacent the base board so as to enclose the at least one semiconductor light-emitting chip, the reflector also including an inner side surface configured to reflect light from the at least one semiconductor light emitting chip during operation of the at least one semiconductor light emitting chip, an outer peripheral side surface facing away from and opposed to the inner side surface, and the top surface being located between the inner side surface and the outer peripheral side surface, the outer peripheral side surface being an outermost peripheral surface of the reflector in a radial direction away from the optical axis of the device;

an encapsulating resin disposed in the reflector;

an optical lens having a concave-shaped cavity contacting the plurality of convex portions of the reflector while facing the top surface of the reflector, the optical lens made from a material having a first softness; and a spacer composed of a transparent resin that has a second softness that is softer than the first softness of the material of the optical lens, the spacer being located between the concave-shaped cavity of the optical lens and the top surface of the reflector, including spaces between each of the plurality of convex portions of the reflector, the spacer extending along the top surface of the reflector and extending downward towards the base board and along at least a portion of the outer peripheral side surface, wherein each of the plurality of convex portions and the spaces between the plurality of convex portions include a width, and a cumulative width of each of the spaces is greater than a cumulative width of each of the plurality of convex portions.

3. The semiconductor light-emitting device according to claim 1, wherein the encapsulating resin is at least one of a transparent resin and a mixture resin, and the mixture resin includes a resin mixed with at least one of a diffuser, a wavelength conversion material, and a pigment configured to selectively absorb light having a predetermined wavelength.

4. The semiconductor light-emitting device according to claim 2, wherein the encapsulating resin is at least one of a transparent resin and a mixture resin, and the mixture resin includes a resin mixed with at least one of a diffuser, a wavelength conversion material, and a pigment configured to selectively absorb light having a predetermined wavelength.

5. The semiconductor light-emitting device according to claim 1, wherein the plurality of convex portions of the optical lens are formed at substantially equal intervals with a width between substantially 0.1 mm and 2.0 mm and a height between substantially 0.1 mm and 2.0 mm, the width and height being measured in a plane that is substantially perpendicular to an optical axis of the device.

6. The semiconductor light-emitting device according to claim 2, wherein the plurality of convex portions of the optical lens are formed at substantially equal intervals with a width between substantially 0.1 mm and 2.0 mm and a height between substantially 0.1 mm and 2.0 mm, the width and height being measured in a plane that is substantially perpendicular to an optical axis of the device.

7. The semiconductor light-emitting device according to claim 3, wherein the plurality of convex portions of the optical lens are formed at substantially equal intervals with a width between substantially 0.1 mm and 2.0 mm and a height between substantially 0.1 mm and 2.0 mm, the width and height being measured in a plane that is substantially perpendicular to an optical axis of the device.

8. The semiconductor light-emitting device according to claim 4, wherein the plurality of convex portions of the optical lens are formed at substantially equal intervals with a width between substantially 0.1 mm and 2.0 mm and a height between substantially 0.1 mm and 2.0 mm, the width and height being measured in a plane that is substantially perpendicular to an optical axis of the device.

9. The semiconductor light-emitting device according to claim 1, wherein the spacer is composed of the same material as the encapsulating resin.

10. The semiconductor light-emitting device according to claim 2, wherein the spacer is composed of the same material as the encapsulating resin.

11. The semiconductor light-emitting device according to claim 3, wherein the spacer is composed of the same material as the encapsulating resin.

12. The semiconductor light-emitting device according to claim 4, wherein the spacer is composed of the same material as the encapsulating resin.

13. The semiconductor light-emitting device according to claim 5, wherein the spacer is composed of the same material as the encapsulating resin.

14. The semiconductor light-emitting device according to claim 6, wherein the spacer is composed of the same material as the encapsulating resin.

15. The semiconductor light-emitting device according to claim 7, wherein the spacer is composed of the same material as the encapsulating resin.

16. The semiconductor light-emitting device according to claim 8, wherein the spacer is composed of the same material as the encapsulating resin.

17. A method for manufacturing a semiconductor light-emitting device according to claim 1, comprising:
   providing the base board that includes at least one pair of chip mounting portions, at least one semiconductor light-emitting chip electrically connected to the base board, the reflector including a cavity that encloses the at least semiconductor light-emitting chip therein, and the optical lens including the concave shaped cavity;
   filling an encapsulating resin in the cavity of the reflector and solidifying the encapsulating resin to a half solidified state by heating;
   disposing the spacer that is not solidified over the reflector that includes the encapsulating resin;
   disposing the optical lens that includes the concave-shaped cavity on the reflector; and
   solidifying both the encapsulating resin and the spacer by heating.

18. The method for manufacturing a semiconductor light-emitting device according to claim 17, wherein providing includes at least one of providing the optical lens with an inner corner surface having a plurality of convex portions, and providing the reflector with the top surface that includes a plurality of convex portions.

19. The method for manufacturing a semiconductor light-emitting device according to claim 17, wherein the encapsulating resin is at least one of a transparent resin and a mixture resin, and the mixture resin includes a resin mixed with at least one of a diffuser, a wavelength conversion material, and a pigment configured to selectively absorb light having a predetermined wavelength.

20. The method for manufacturing a semiconductor light-emitting device according to claim 18, wherein the encapsulating resin is at least one of a transparent resin and a mixture resin, and the mixture resin includes a resin mixed with at least one of a diffuser, a wavelength conversion material, and a pigment configured to selectively absorb light having a predetermined wavelength.

21. The method for manufacturing a semiconductor light-emitting device according to claim 18, wherein the plurality of convex portions are formed at substantially equal intervals with a width between substantially 0.1 mm and 2.0 mm and a height between substantially 0.1 mm and 2.0 mm, the width and height being measured in a plane that is substantially perpendicular to an optical axis of the device.

22. The method for manufacturing a semiconductor light-emitting device according to claim 19, wherein the plurality of convex portions are formed at substantially equal intervals with a width between substantially 0.1 mm and 2.0 mm and a height between substantially 0.1 mm and 2.0 mm, the width and height being measured in a plane that is substantially perpendicular to an optical axis of the device.

23. The method for manufacturing a semiconductor light-emitting device according to claim 20, wherein the plurality of convex portions are formed at substantially equal intervals with a width between substantially 0.1 mm and 2.0 mm and a height between substantially 0.1 mm and 2.0 mm, the width and height being measured in a plane that is substantially perpendicular to an optical axis of the device.

24. The method for manufacturing a semiconductor light-emitting device according to claim 18, wherein the spacer is composed of the same material as the encapsulating resin.

25. The method for manufacturing a semiconductor light-emitting device according to claim 19, wherein the spacer is composed of the same material as the encapsulating resin.

26. The method for manufacturing a semiconductor light-emitting device according to claim 20, wherein the spacer is composed of the same material as the encapsulating resin.

27. The method for manufacturing a semiconductor light-emitting device according to claim 21, wherein the spacer is composed of the same material as the encapsulating resin.

28. The method for manufacturing a semiconductor light-emitting device according to claim 22, wherein the spacer is composed of the same material as the encapsulating resin.

29. The method for manufacturing a semiconductor light-emitting device according to claim 23, wherein the spacer is composed of the same material as the encapsulating resin.

30. The semiconductor light-emitting device according to claim 1, wherein the reflector is tubular in shape and encloses the at least one semiconductor light-emitting chip.

31. The semiconductor light-emitting device according to claim 3, wherein the wavelength conversion material is a phosphor.

32. The semiconductor light-emitting device according to claim 2, wherein the reflector is tubular in shape.

33. The semiconductor light-emitting device according to claim 4, wherein the wavelength conversion material is a phosphor.

34. The method for manufacturing a semiconductor light-emitting device according to claim 17, wherein the reflector is tubular in shape.

35. The method for manufacturing a semiconductor light-emitting device according to claim 19, wherein the wavelength conversion material is a phosphor.

36. The method for manufacturing a semiconductor light-emitting device according to claim 20, wherein the wavelength conversion material is a phosphor.

37. The method for manufacturing a semiconductor light-emitting device according to claim 17, wherein the providing, filling, disposing a spacer, disposing the optical lens, and solidifying both the encapsulating resin and the spacer are accomplished sequentially.

38. A semiconductor light-emitting device comprising:
a base board having at least one pair of chip mounting portions;
at least one semiconductor light-emitting chip located adjacent the base board and configured to emit light along an optical axis of the device;
a reflector located adjacent the base board and the at least one semiconductor light-emitting chip, the reflector including an inner side surface configured to reflect light from the at least one semiconductor light emitting chip during operation of the at least one semiconductor light emitting chip, an outer peripheral side surface facing away from and opposed to the inner side surface, and a top surface located between the inner side surface and the outer peripheral side surface, the outer peripheral side surface being an outermost peripheral surface of the reflector in a radial direction away from the optical axis of the device;
an encapsulating resin disposed adjacent the reflector;
an optical lens having a concave-shaped cavity and being composed of a material having a first softness; and
a spacer composed of a transparent resin that has a second softness that is softer than the first softness of the material of the optical lens, the spacer being located between the concave-shaped cavity of the optical lens and the reflector, the spacer extending along the top surface of the reflector and extending downward towards the base board and along at least a portion of the outer peripheral side surface,
wherein at least one of the reflector and the optical lens includes a plurality of convex portions located about the concave shaped cavity of the optical lens, and the plurality of convex portions in combination with a surface of the optical lens and a surface of the reflector define a plurality of openings spaced about the concave shaped cavity and in which the transparent resin is located.

* * * * *